United States Patent [19]

Yamada et al.

[11] Patent Number: 5,130,540
[45] Date of Patent: Jul. 14, 1992

[54] METHOD AND APPARATUS FOR AUTOMATIC FOCUSING OF SCANNING ELECTRON MICROSCOPE

[75] Inventors: Atsushi Yamada, Mizuhomachi; Mitsuru Yamada, Tokyo; Kouichi Suefuji, Tokyo; Tsutomu Negishi, Tokyo; Kunihiko Uchida, Tokyo, all of Japan

[73] Assignee: Jeol Ltd., Tokyo, Japan

[21] Appl. No.: 731,785

[22] Filed: Jul. 17, 1991

[30] Foreign Application Priority Data

Jul. 17, 1990 [JP] Japan .................. 2-189226

[51] Int. Cl.$^5$ .............................. H01J 37/21
[52] U.S. Cl. ........................ 250/310; 250/307; 250/396 R; 250/396 ML; 250/397
[58] Field of Search ............ 250/306, 307, 310, 311, 250/397, 396 R, 396 ML

[56] References Cited

U.S. PATENT DOCUMENTS 4,199,681  4/1980  Namae .................. 250/311

FOREIGN PATENT DOCUMENTS 60-54152  3/1985  Japan .................. 250/396 R

Primary Examiner—Jack I. Berman
Attorney, Agent, or Firm—Webb, Burden, Ziesenheim & Webb

[57] ABSTRACT

Method and an apparatus for automatically moving the focal plane of the electron beam produced by a scanning electron microscope to the position of specimen surface. An auxiliary coreless coil of a low inductance is disposed close to the objective lens. The exciting current fed to the coil is varied to move the focal plane of the electron beam toward the optical axis. At each of discrete positions of the focal plane, a specimen is scanned with the electron beam. The resulting secondary electrons are detected by a detector. Individual output signals from the detector are compared to select the maximum signal. Then, only the objective lens is excited. The exciting current fed to the objective lens is modified to move the focal plane along the position closest to the specimen surface.

7 Claims, 6 Drawing Sheets

METHOD AND APPARATUS FOR AUTOMATIC FOCUSING OF SCANNING ELECTRON MICROSCOPE

FIELD OF THE INVENTION

The present invention relates to a method and an apparatus for performing automatic focusing action in a scanning electron microscope.

BACKGROUND OF THE INVENTION

Several methods have been adopted to automatically adjust the focus in scanning electron microscopes. One of them is illustrated in FIG. 5.

As shown in FIG. 5, a deflection unit 14 receives a timing signal from a control unit 5. The deflection unit 14 creates a horizontal, or X-direction, scanning signal and a vertical, or Y-direction, scanning signal according to the timing signal, and supplies these signals to a deflection coil 2. The control unit 5 produces a digital signal for indicating the value of the exciting current fed to an objective lens 3. This digital signal is converted into analog form by a digital-to-analog (D/A) converter 15 and sent to a driver circuit 16. The electron beam 1 emitted by an electron gun (not shown) is deflected in the X- and Y-directions by the deflection coil 2. The beam 1 is focused by the objective lens 3, and a desired region on a specimen surface 4 is scanned with this focused beam 1. During this scan, the value of the exciting current supplied to the objective lens 3 is changed in increments of $\Delta I$ within a given range. In particular, as shown in FIG. 6, whenever a given time $T_0$ elapses, the exciting current is varied by $\Delta I$. During the given time $T_0$, the electron beam 1 raster scans the specimen surface for obtaining one frame of image. The secondary electrons released from the specimen surface 4 during this scan are detected by a detector 6 and converted into an electrical signal, which is sent to a signal-detecting unit 7 having a low-pass filter 8 and a high-pass filter 9. These filters 8 and 9 remove noises from the incoming signal. The signal from which the noises have been removed is supplied to an absolute value circuit 10 which takes the absolute value of the input signal. An integrator circuit 12 integrates the signal passed through the absolute value circuit 10 which corresponds to one frame. The output signal from the integrator circuit 12 is converted into digital form by an analog-to-digital (A/D) converter 13 and fed to the control unit 5. It is assumed that when the exciting current fed to the objective lens assumes values $I_1, I_2, I_3, \ldots I_n$, the integrated values supplied to the control unit 5 are $S(I_1), S(I_2), S(I_3), \ldots S(I_n)$, respectively. The control unit 5 calculates the relation between the exciting current and the integrated value from the above values, and then finds the objective lens-exciting current value $I_0$ (FIG. 7) giving the maximum integrated value from the calculated relation. This current value $I_0$ is taken as the exciting current which provides the focused condition. Therefore, the objective lens is set at this current value $I_0$ to achieve focusing.

In the above-described prior art automatic focusing system, focusing is attained by evaluating the output signal from the secondary electron detector, the output signal being derived immediately after the objective lens current is varied in an increment as shown in FIG. 6. This makes it impossible to accomplish accurate focusing. Specifically, the exciting coil of the objective lens has a large inductance. Therefore, if the current is varied, the current flowing through the exciting coil of the objective lens does not vary instantaneously; rather it changes gradually as indicated by the dotted lines in FIG. 6. Accordingly, if one evaluates the output signal from the secondary electron detector and judges the focused condition immediately after the exciting current is varied as mentioned previously, the focused condition is not maintained when the exciting current settles into stationary state.

One contemplated method for solving this problem is to detect and evaluate the output signal from the secondary electron detector after the amplitude of the exciting current fed to the objective lens has settled into stationary state. Then, the exciting current providing focused condition is determined. However, it is time-consuming to perform automatic focusing action by this method.

Scanning electron microscopes free of this problem have been developed. In particular, a small auxiliary coil is disposed close to the objective lens. The exciting current supplied to this auxiliary coil is varied to search for the focus. One example of such scanning electron microscopes is disclosed in U.S. Pat. No. 4,199,681. In this disclosed microscope, if the exciting current to be supplied to the auxiliary coil for achieving focused condition is determined, then the focusing operation is completed while this current is kept supplied to the auxiliary coil. However, if an electrical current close to the maximum allowable current value has already flowed through the auxiliary coil when the focusing operation is completed, then it is not possible to widen the searched area in the direction to increase the current according to the changing position of the specimen. Eventually, it is only possible to search a narrow area for the focus. This type of electron microscope has another disadvantage. Specifically, if the electrical current flowing through the auxiliary coil is relatively large after the completion of the focusing action, a slight deviation of the axis of the auxiliary coil from that of the objective lens produces a distortion in the image. This makes it impossible to observe good-quality images.

SUMMARY OF THE INVENTION

It is an object of the invention to provide a method of automatically focusing a scanning electron microscope quickly and accurately.

It is another object of the invention to provide an apparatus which quickly, accurately, and automatically focuses a scanning electron microscope.

It is a further object of the invention to provide a method and apparatus which are used for automatic focusing of a scanning electron microscope having an auxiliary coil of a low inductance and which permits images to be displayed without being affected by the deviation of the axis of the auxiliary coil from the axis of the objective lens.

It is still another object of the invention to provide a method and an apparatus which permit a scanning electron microscope having an auxiliary coil of low inductance to search a wide area for the focus for achieving automatic focusing.

Other objects and features of the invention will appear in the course of the description whereof which follows.

DETAILED DESCRIPTION OF THE INVENTION

Figure 1:
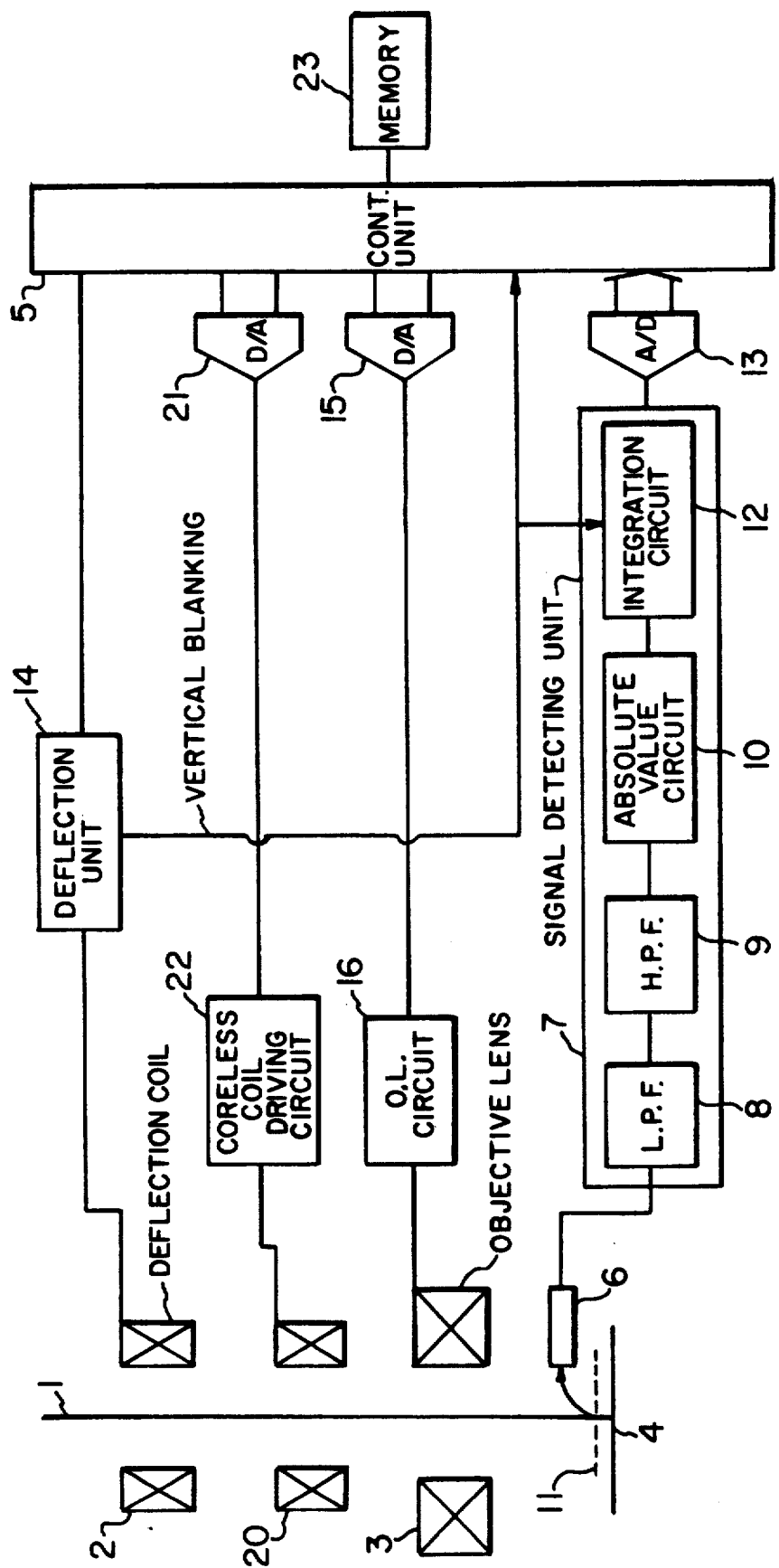
FIG. 1 is a block diagram of a scanning electron microscope according to the invention.
Figure 2:
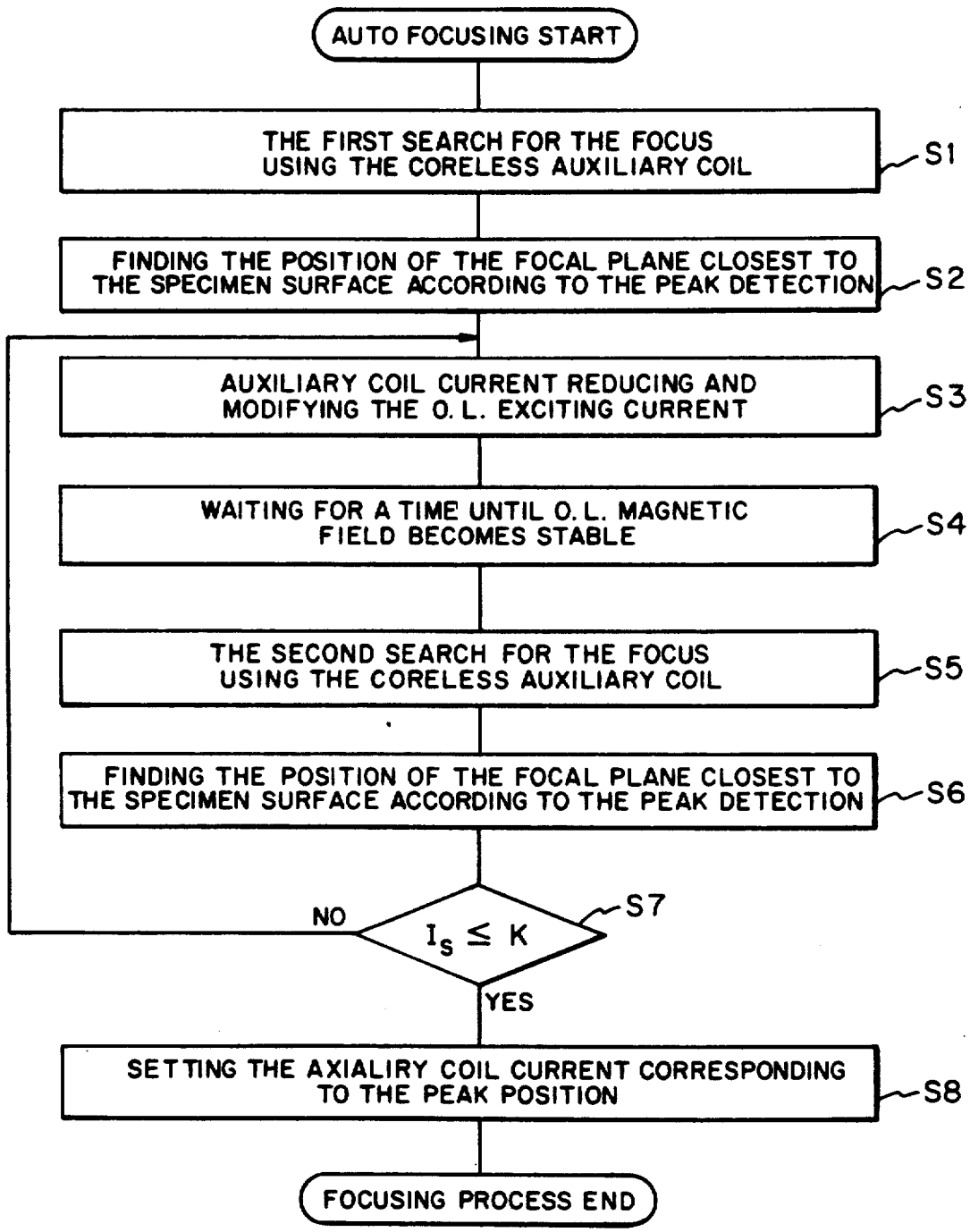
FIG. 2 is a flowchart illustrating a method of automatically focusing the electron microscope shown in FIG. 1.
Figure 5:
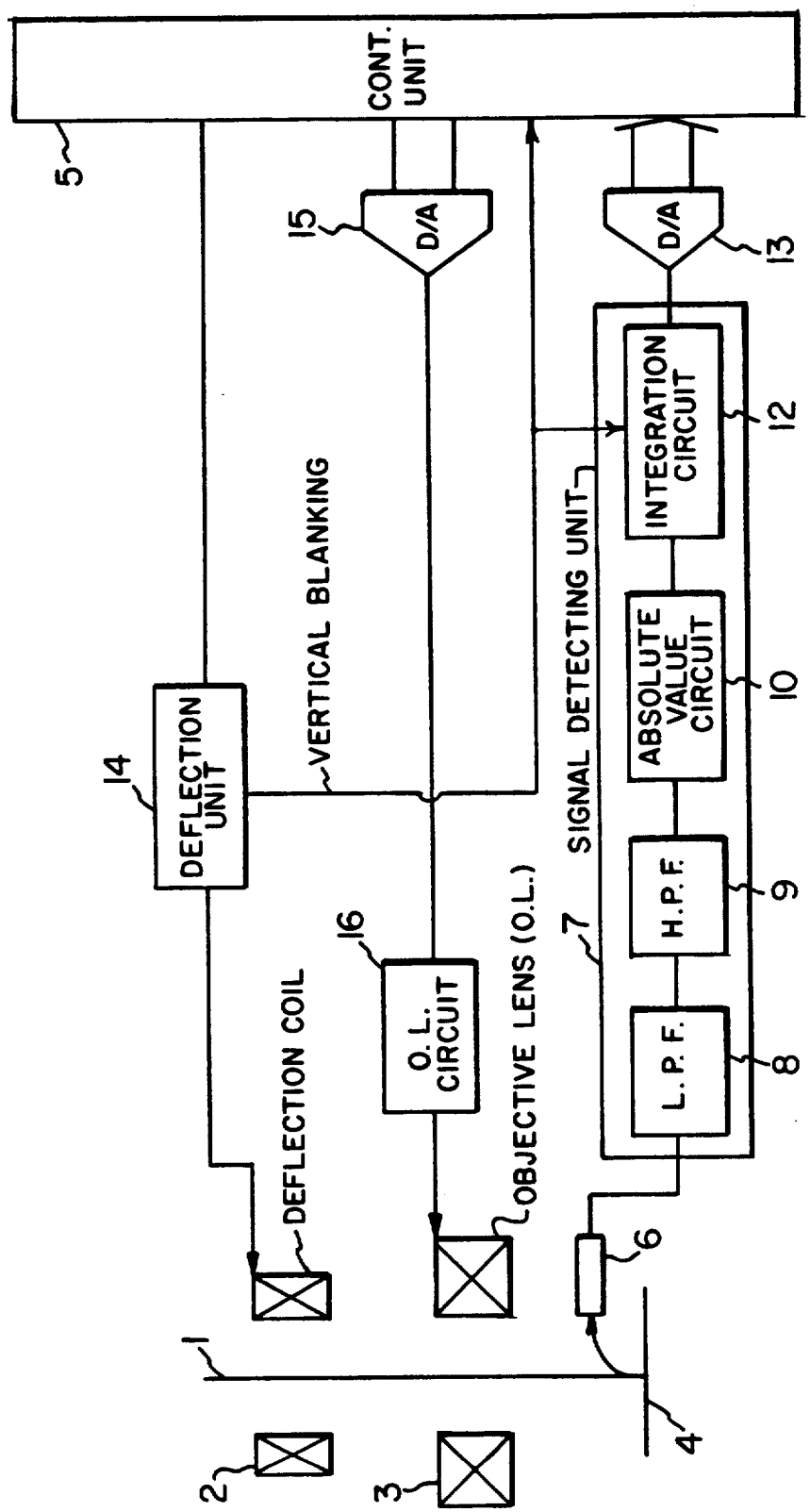
FIG. 5 is a block diagram of the prior art scanning electron microscope.
Figure 6:
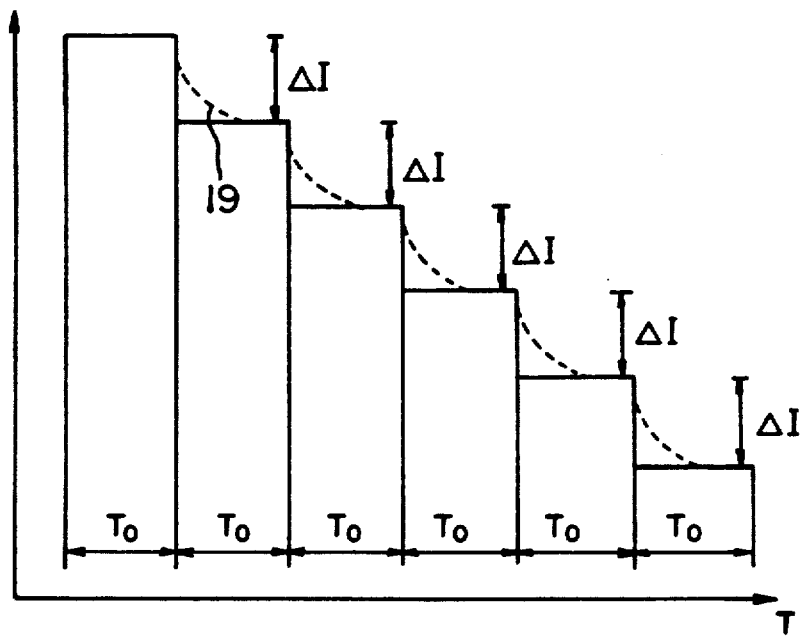
FIG. 6 is a graph in which the exciting current fed to the objective lens of the prior art microscope shown in FIG. 5 is plotted against time for illustrating the disadvantage that the prior art microscope shown in FIG. 5 entails.
Figure 7:
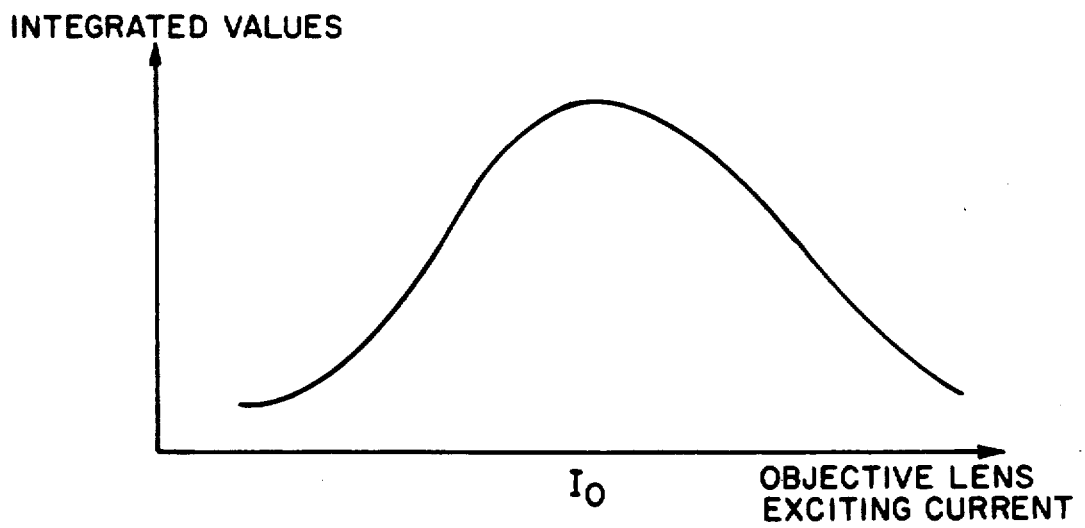
FIG. 7 is a graph in which integrated value is plotted against the exciting current fed to the objective lens for showing the peak of the integrated value, the integrated value being used as an evaluating signal in determining the position of the focus.

Referring to FIG. 1, there is shown a scanning electron microscope according to the invention. FIG. 1 is similar to FIG. 5 except that an auxiliary coreless coil 20 is disposed close to the objective lens 3. The number of turns of wire forming the coil is limited to reduce the inductance. The auxiliary coil 20 is disposed close to the objective lens 3 such that the magnetic field produced by the coil 20 may be superimposed on the magnetic field set up by the objective lens. An exciting current is supplied to the auxiliary coil 20 from an auxiliary coil driver circuit 22. To specify the value of the exciting current, an analog signal is sent from a D/A converter 21 to the auxiliary coil driver circuit 22. A memory 23 is connected with the control unit 5. Tables of data for specifying the value of the exciting current fed to the objective lens 3 are stored in the memory 23.

Figure 3:
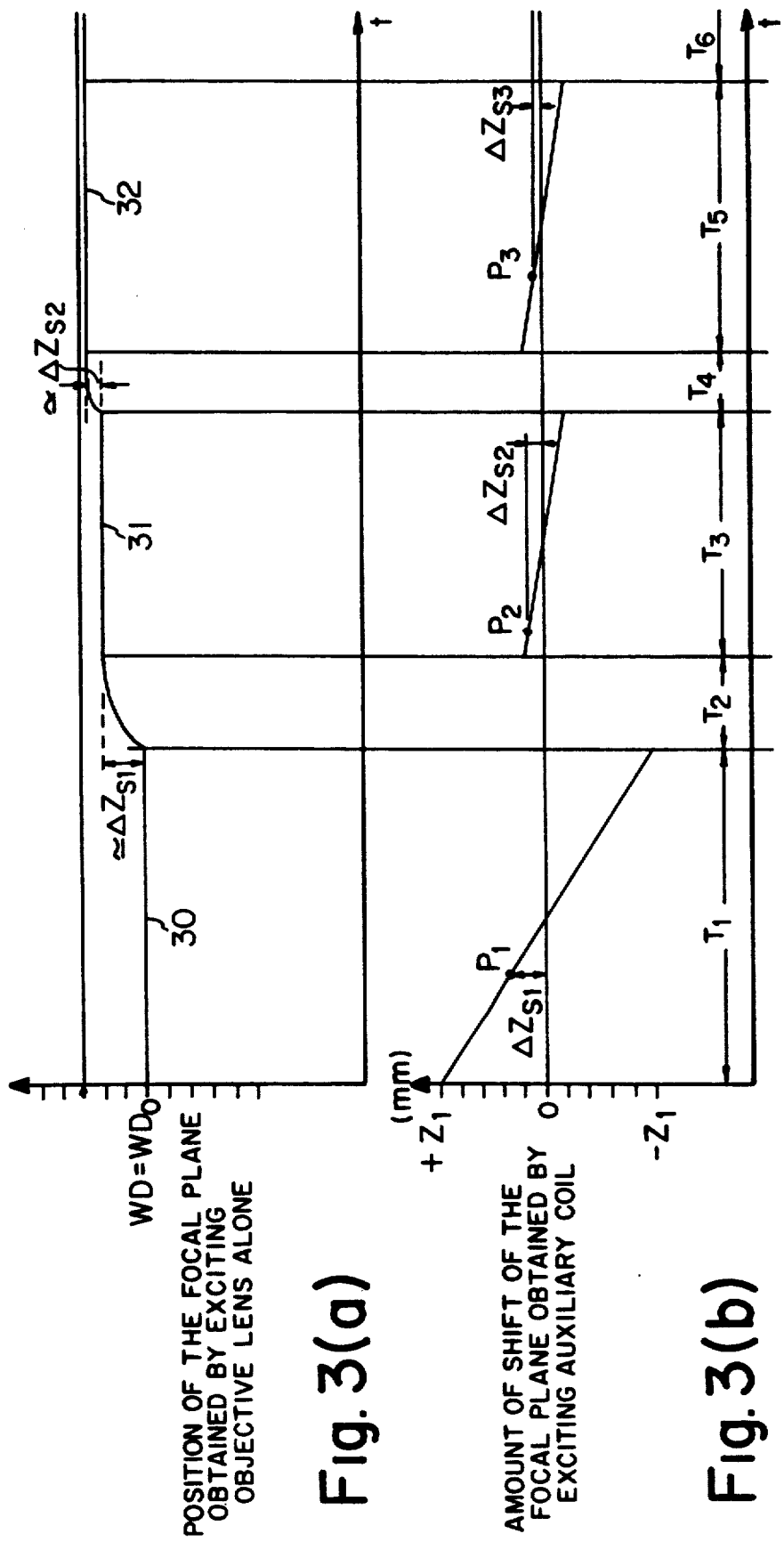
FIG. 3(a) is a diagram in which the position of the focal plane in the microscope shown in FIG. 1 is plotted against time for illustrating the manner in which the focal plane is moved by exciting the objective lens alone.
FIG. 3(b) is a diagram similar to FIG. 3(a), but obtained when the focal plane is moved by exciting the auxiliary coil.
Figure 4:
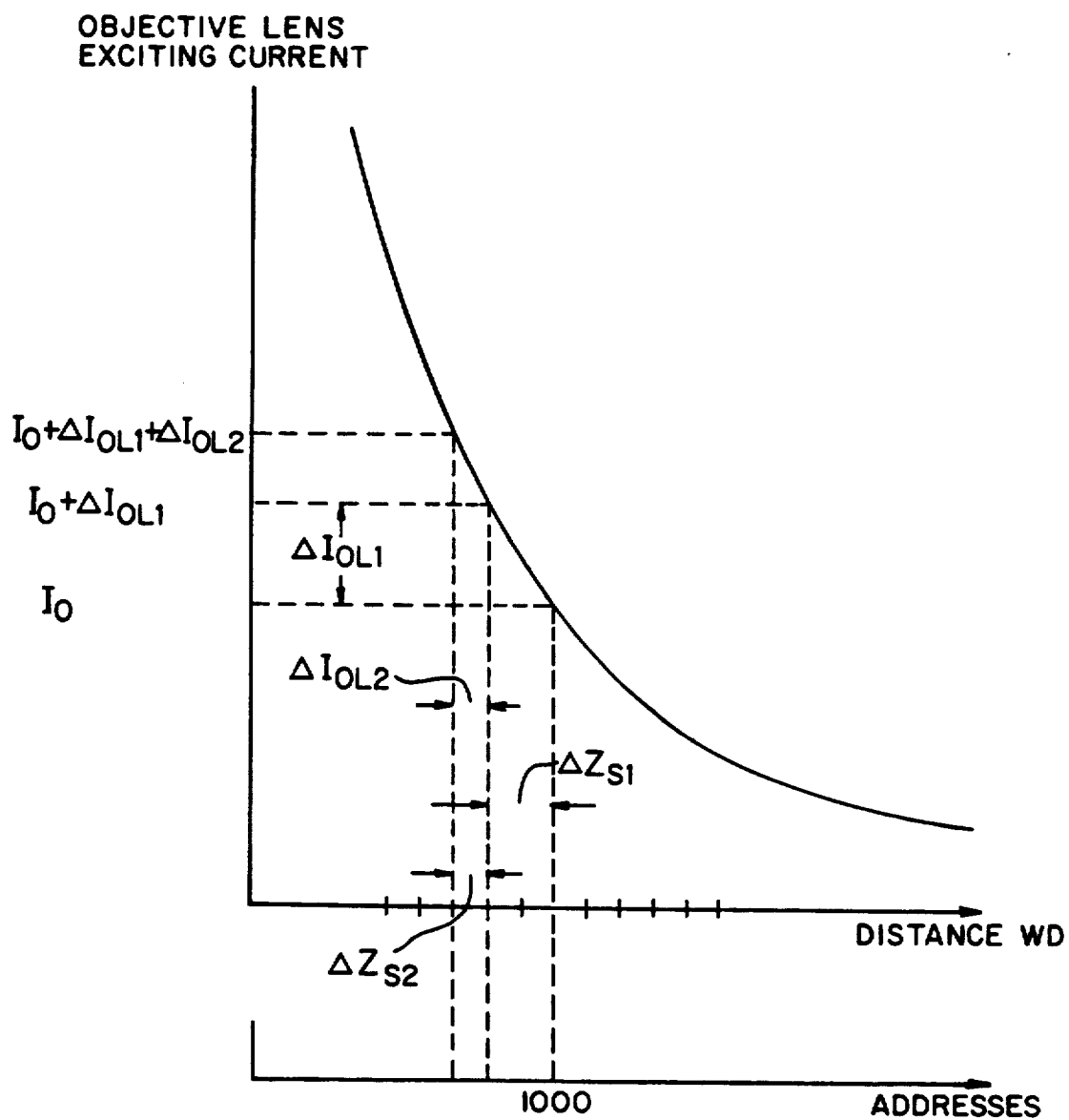
FIG. 4 is a graph in which the exciting current fed to the objective lens of the electron microscope shown in FIG. 1 is plotted against the distance WD and also with regard to addresses in a memory.

When the start of automatic focusing action is ordered, the control unit 5 makes the distance WD between the principal plane of the objective lens 3 and the focal plane 11 of the electron beam equal to a standard value $WD_0$. The electron beam is focused most sharply on the focal plane. For this purpose, the control unit 5 supplies standard current $I_0$ shown in FIG. 4 to the objective lens 3. FIG. 4 also illustrates the contents of the tables of data described above. In FIG. 4, the horizontal axis indicates the addresses in the memory 23 corresponding to individual values of the distance WD. The vertical axis indicates those values of the exciting current fed to the objective lens which are necessary to bring the focal plane 11 into the locations corresponding to the above individual values of the distance WD when only the objective lens is excited. The standard current $I_0$ is supplied to the objective lens 3. Under this condition, the control unit 5 shifts the focal plane 11 of the electron beam along the optical axis by varying the current supplied to the auxiliary coil 20. FIG. 3(b) shows the movement of the focal plane caused by the auxiliary coil. In FIG. 3(b), the amount of shift of the focal plane is plotted on the vertical axis, while time is plotted on the horizontal axis.

In the first search for the focus, the control unit 5 varies the exciting current fed to the auxiliary coil 20 so that the amount of change in the distance WD may vary from $+Z_1$ to $-Z_1$ (mm). This sweep is made during a period of $T_1$ (step 1). The position of the focal plane is shown to vary continuously in FIG. 3(b). In practice, however, the position of the focal plane changes in a stepwise fashion and is switched between 32 locations. Whenever the auxiliary current fed to the auxiliary coil 20 assumes a value corresponding to each different one of these locations, the electron beam 1 scans the specimen 4 to obtain one frame of image. The range of movement of the focal plane is set relatively narrow, because if large electrical currents flow through the auxiliary coil 20, then the response becomes slow. Also, the effects of the deviation of the axis of the auxiliary coil from the axis of the objective lens become more conspicuous. When the first search for the focus using the coreless auxiliary coil 20 ends and the collection of data, or integrated value, is completed, the control unit 5 finds the condition in which the integrated value assumes its peak value. Under this condition, the position of the focal plane 11 is closest to the specimen surface (step 2). This condition is indicated by $P_1$ in FIG. 3(b). The control unit 5 calculates the value $\Delta I$ of the exciting current fed to the auxiliary coil under this condition. Since a given relation exists between the exciting current fed to the auxiliary coil and the amount of shift of the focal plane, i.e., this amount is a function of the exciting current fed to the auxiliary coil, the control unit 5 converts data indicating the exciting current value $\Delta I$ into data indicating the amount of shift of the focal plane caused by the auxiliary coil 20. Then, the control unit 5 finds an exciting current value of the objective lens which is needed to cause the focal plane of the electron beam to move the distance $\Delta Z_{S1}$ by exciting the objective lens alone. It is now assumed that the standard exciting current $I_0$ is stored at address 1000 in the memory. In order to shift the focal plane by an amount corresponding to the amount of shift $\Delta Z_{S1}$, the control unit 5 reads the value stored at the address which is shifted with respect to address 1000 by an amount corresponding to the amount of shift $\Delta Z_{S1}$. The objective lens 3 is excited with the exciting current of the value read out in this way (step 3). Meanwhile, the control unit 5 reduces the exciting current fed to the auxiliary coil 20 down to zero. Subsequently, the control unit 5 waits for a time $T_2$, i.e., until the strength of the magnetic field developed by the objective lens 3 becomes stable (step 4). As a result, the objective lens is excited with the exciting current of value $I_0 + \Delta I_{OL1}$. That is, only the objective lens 3 is excited. At this time, the position of the focal plane changes from 30 to 31 in FIG. 3(a). Since the objective lens shows hysteresis, the amount of shift of the focal plane often deviates from $\Delta Z_{S1}$. Therefore, further search for the focus is necessary. In FIG. 3(a), the position of the focal plane assumed when only the objective lens 3 is excited is plotted on the vertical axis, whereas time is plotted on the horizontal axis.

After the waiting, the control unit 5 makes the second search for the focus, using the auxiliary coil 20 (step 5).

Also in this second search, each time each individual exciting current is supplied to the auxiliary coil 20, the output signal from the detector is integrated to obtain one frame of image. This search persists for a time $T_3$. After the end of this search, the control unit 5 selects that value of the auxiliary coil-exciting current which provides the maximum integrated value (step 6). We now assume that the integrated value assumes its maximum value at point $P_2$ in FIG. 3(b) and that the exciting current fed to the auxiliary coil at this point $P_2$ is $I_{S2}$. The control unit 5 makes a decision to determine whether $I_{S2}$ is less than a given reference value K or not (step 7). If the result of this decision is that $I_{S2}$ is less than K, then this automatic focusing process is ended. If $I_{S2}$ is greater than K, step 3 and the following steps are repeated. FIGS. 3(a) and 3(b) show the latter case, i.e., step 3 and the following steps are repeated. In this case, the optimum amount of shift $\Delta Z_{S2}$ of the focal plane that is found by the second search is replaced by a change in the exciting current fed to the objective lens 3. As a result, the exciting current supplied to the objective lens 3 takes a value $I_0 + \Delta I_{OL1} + \Delta I_{OL2}$ shown in FIG. 4.

Then, the control unit waits until the strength of the magnetic field generated by the objective lens 3 becomes stable, i.e., for a time $T_4$ (step 4). The third search for the focus is made for a time $T_5$, using the auxiliary coil 20. It is assumed that the optimum amount of shift of the focal plane which is found by this search and caused by the auxiliary coil 20 is $Z_{S3}$ and that the exciting current fed to the auxiliary coil 20 under this condition is $I_{S3}$. If the result of the decision made in step 7 is that $I_{S3} \leq K$, then the control unit 5 maintains the exciting current fed to the objective lens 3 at the above-described value $I_0 + \Delta I_{OL1} + \Delta I_{OL2}$. At the same time, the exciting current supplied to the auxiliary coil 20 is set to $I_{S3}$. Then, this automatic focusing process is ended.

It is to be understood that the foregoing constitutes only one embodiment of the invention and that various modifications and changes can be made in practicing it.

In the above example, if the relation $I_{S3} \leq K$ holds, the control unit 5 no longer changes the exciting current fed to the objective lens. Instead, the exciting current fed to the auxiliary coil is set to $I_{S3}$ so that the focal plane may be shifted by $Z_{S3}$ by means of the excitation of the auxiliary coil. Then, the focusing process is ended. More specifically, in the above example, the exciting current to the auxiliary coil is not at level 0 when the focusing action is completed. The image quality is not affected if the auxiliary coil is kept excited during observation of an image, since the value K is selected to be sufficiently small. However, it is also possible to reduce the exciting current fed to the auxiliary coil down to zero and to modify the exciting current fed to the objective lens once again before the end of the focusing operation.

Also in the above example, a coreless coil is used as the auxiliary coil of a low inductance. If the inductance is sufficiently low, the coil is not always restricted to the coreless type.

In the above example, the absolute value of the output signal from the secondary electron detector is taken and then integrated to find the position closest to the focal point. If the degree of the approximation to the focal point can be judged, other signal processing may also be effected. In one of such processing, the output signal from the detector may be differentiated, and then the absolute value of the differentiated signal may be taken. The absolute value is subsequently integrated.

In the above example, the amount of shift of the focal plane is found from the value $\Delta I$ of the exciting current fed to the auxiliary coil. If the control unit 5 first plots the integrated value against the position of the focal plane to know the relation between them then it is not necessary to find the value $\Delta Z_{S1}$ or other value from the exciting current value $\Delta I$; rather $\Delta Z_{S1}$ or other value can be found directly.

In the above example, a step where the exciting current fed to the auxiliary coil was reduced to zero is inserted before the second search is started. However, this step can be eliminated.

In accordance with the present invention, the auxiliary coil is used to search for the focus. Correspondingly, the exciting current fed to the objective lens is modified. Hence, large currents do not flow through the auxiliary coil after the focused condition has been realized. Therefore, if the axis of the auxiliary coil deviates from the axis of the objective lens, astigmatism is not present when observation of the specimen is carried out. In other words, the image quality does not drop if the axis of the auxiliary coil deviates from the axis of the objective lens.

Having thus described our invention with the detail and particularity required by the Patent Laws, what is claimed to be protected by Letters Patent is set forth in the following claims.

What is claimed is:

1. A method of automatically focusing a scanning electron microscope emitting an electron beam and having an objective lens and an auxiliary coil of a low inductance, the auxiliary coil being disposed close to the objective lens, said method comprising the steps of:
   (a) varying the exciting current fed to the auxiliary coil to move the focal plane of the electron beam along the optical axis;
   (b) scanning a specimen with the electron beam at each different position of the focal plane of the beam;
   (c) evaluating the resulting signals and finding the position of the focal plane closest to the specimen surface; and
   (d) modifying the exciting current fed to the objective lens to move the focal plane toward said position closest to the specimen surface by exciting the objective lens alone.

2. The method of claim 1, wherein the above steps (a)–(d) are repeated to effect automatic focusing.

3. The method of claim 2, wherein the value $I_S$ of the exciting current fed to the auxiliary coil at said position closest to the specimen surface is compared with a reference value, and wherein if this value $I_S$ is less than the reference value, then the auxiliary coil is excited with the exciting current of the value $I_S$, whereby the focusing operation is ended without carrying out the step (d).

4. The method of claim 1, wherein said auxiliary coil of a low inductance is a coreless coil.

5. An apparatus for automatically focusing a scanning electron microscope emitting an electron beam and having an objective lens, said apparatus comprising:
   a scanning means for scanning the surface of a specimen with the electron beam focused by the objective lens;
   an auxiliary coil disposed close to the objective lens;
   a means which varies the current fed to the coil to move the focal plane of the electron beam along the optical axis, for searching for the position closest to the specimen surface;

a means for evaluating the signal obtained by the search and finding the amount of shift of the focal plane caused by the auxiliary coil at the position closest to the specimen surface; and a means for changing the exciting current fed to the objective lens according to a signal indicating the amount of shift of the focal plane.

6. The apparatus of claim 5, wherein said means for evaluating the signals obtained by the search and finding the amount of shift of the focal plane comprises: a means for finding the value of the exciting current fed to the auxiliary coil when the focal plane of the electron beam is closest to the specimen surface; and a means for converting a signal indicating the value of the exciting current into a signal indicating the amount of shift of the focal plane.

7. The apparatus of claim 5, wherein said auxiliary coil of a low inductance is a coreless coil

* * * * *